United States Patent
Komuro et al.

(10) Patent No.: US 6,864,299 B1
(45) Date of Patent: Mar. 8, 2005

(54) PROCESS FOR PRODUCING CURED PHOTOCHROMIC

(75) Inventors: Yasuko Komuro, Tokuyama (JP); Junji Momoda, Tokuyama (JP)

(73) Assignee: Tokuyama Corporation, Tokuyama (JP)

( * ) Notice: Subject to any disclaimer, the term of this patent is extended or adjusted under 35 U.S.C. 154(b) by 70 days.

(21) Appl. No.: 10/333,775
(22) PCT Filed: Aug. 11, 2000
(86) PCT No.: PCT/JP00/05407

§ 371 (c)(1),
(2), (4) Date: Jan. 24, 2003

(87) PCT Pub. No.: WO02/14387

PCT Pub. Date: Feb. 21, 2002

(51) Int. Cl.$^7$ .............................. C08F 2/48; C08L 33/06; G02F 1/03; G02B 5/23; G02C 7/10
(52) U.S. Cl. .............................. 522/13; 522/24; 522/18; 522/75; 264/1.36; 264/1.38
(58) Field of Search ............................... 522/13, 24, 18, 522/28, 39, 64, 75, 182; 359/241–244; 264/1.36, 1.38; 252/586; 430/962

(56) References Cited

U.S. PATENT DOCUMENTS

| | | | | |
|---|---|---|---|---|
| 4,396,737 A | * | 8/1983 | Leatherman | ................. 524/176 |
| 5,336,743 A | * | 8/1994 | Takaoka et al. | .......... 526/292.4 |
| 5,621,017 A | | 4/1997 | Kobayakawa et al. | |
| 5,811,503 A | * | 9/1998 | Herold et al. | ............. 526/323.2 |
| 5,910,516 A | * | 6/1999 | Imura et al. | ................... 522/39 |
| 5,976,422 A | | 11/1999 | Okoroafor et al. | |
| 5,981,634 A | * | 11/1999 | Smith et al. | ................... 524/87 |
| 6,248,285 B1 | * | 6/2001 | Henry et al. | ................ 264/496 |
| 6,572,794 B1 | * | 6/2003 | Berzon et al. | ............. 264/1.38 |

FOREIGN PATENT DOCUMENTS

| | | |
|---|---|---|
| JP | 6-56948 A | 3/1994 |
| JP | 7292011 A | 11/1995 |
| JP | 9-302336 A | 11/1997 |
| JP | 11-292909 A | 10/1999 |
| WO | WO 96/37573 A1 | 11/1996 |
| WO | WO 00/34805 A2 | 6/2000 |

* cited by examiner

Primary Examiner—Susan Berman
(74) Attorney, Agent, or Firm—Birch, Stewart, Kolasch & Birch, LLP

(57) ABSTRACT

The present invention is aimed to produce a cured product having excellent photochromism which can be easily polymerized in a short period of time. The cured product is obtained by photopolymerizing a polymerizable composition comprising (A) a radical polymerizable monomer, (B) an ultraviolet polymerization initiator having the main absorption at an ultraviolet range and a molar absorption coefficient for light having a wavelength of 400 nm of 150 liter/(mol·cm) or more, (C) a thermopolymerization initiator such as a thermopolymerization initiator having a temperature at which the half-life thereof is 10 hours of 60° C. or more and (D) a photochromic compound by irradiating activation energy rays having a wavelength of 400 nm or more as the main emission spectrum, preferably to ensure that the temperature of the cured product does not exceed 50° C., and further thermopolymerizing the composition by heating.

7 Claims, No Drawings

PROCESS FOR PRODUCING CURED PHOTOCHROMIC

This application is the national phase under 35 U.S.C. § 371 of PCT International Application No. PCT/JP00/05407 which has an International filing date of Aug. 11, 2000, which designated the United States of America.

BACKGROUND OF THE INVENTION

1. Field of the Invention

The present invention relates to a process for producing a photochromic cured product having excellent photochromism which is polymerized and cured in a short period of time by combining photopolymerization and thermopolymerization.

2. Prior Art

Photochromism which has attracted much attention for the past few years is a reversible phenomenon that a certain compound changes its color immediately upon exposure to light including ultraviolet rays such as sunlight or light from a mercury lamp and returns to its original color when it is placed in the dark by stopping irradiation. A compound having this property is called "photochromic compound". Various compounds have been synthesized to such a compound heretofore but any common structure is not observed in these compounds.

Cured products which exhibit photochromism are obtained by coating the surface of a molded polymer with a photochromic compound or by dissolving a photochromic compound in a radically polymerizable monomer and polymerizing and curing the resulting mixture (to be referred to as "kneading method" hereinafter).

There are known methods for polymerizing a radically polymerizable monomer: (1) one in which polymerization is carried out by heat and (2) one in which polymerization is carried out by light. When a radically polymerizable monomer is to be polymerized by light in the above kneading method, the radically polymerizable monomer cannot be suitably polymerized because the contained photochromic compound absorbs ultraviolet rays required for the cleavage of an ultraviolet polymerization initiator and develops color itself by the absorption of ultraviolet rays to prevent the transmission of light.

As means of solving the above problems, JP-A 7-292011 (the term "JP-A" as used herein means an "unexamined published Japanese patent application") discloses a method for carrying out polymerization by reducing the amount of a photochromic compound. However, the colorablility of the obtained photochromic cured product cannot be increased by this method. WO 96/37573 discloses a method which combines a specific ultraviolet polymerization initiator and activation energy rays having a specific emission spectrum. However, it cannot be said that a photochromic cured product obtained by this method is satisfactory in terms of photochromism durability.

The inventors of the present invention have found that photochromism durability greatly lowers in a polymer which is not polymerized completely by using photopolymerization. To obtain a perfect polymer, the exposure time must be prolonged. However, when the exposure time is long, a photochromic compound is deteriorated by exposure.

Consequently, when a photochromic cured product is to be obtained, thermopolymerization is generally used to polymerize a radically polymerizable monomer. However, the time required for thermopolymerization is extremely long, for example, several tens of hours, compared with photopolymerization. Therefore, thermopolymerization is unsatisfactory in terms of the productivity of cured products.

SUMMARY OF THE INVENTION

In view of the above, it is an object of the present invention to provide a process for producing a photochromic cured product having high colorability and sufficiently high hardness in a short period of time by dissolving a photochromic compound in a radically polymerizable monomer and then polymerizing and curing the resulting mixture.

It is another object of the present invention to provide a process for producing a photochromic cured product, which prevents the deterioration of a photochromic cured product during polymerization.

It is still another object of the present invention to provide a process for producing a photochromic cured product which turns from achromatic to colored upon exposure to light including ultraviolet rays, such as sunlight or light from a mercury lamp, and returns to the original state upon the stoppage of exposure, and has excellent photochromic properties and repeated durability.

It is a further object of the present invention to provide a process for producing a photochromic cured product which has little optical distortion and can be advantageously used as a lens for spectacles.

Other objects and advantages of the present invention will become apparent from the following description.

According to the present invention, the above objects and advantages of the present invention are attained by a process for producing a photochromic cured product, comprising the steps of:

photopolymerizing a polymerizable composition comprising (A) a radical polymerizable monomer, (B) an ultraviolet polymerization initiator having the main absorption at an ultraviolet range and a molar absorption coefficient for light having a wavelength of 400 nm of 150 liter/(mol·cm) or more, (C) a thermopolymerization initiator and (D) a photochromic compound by irradiating activation energy rays having a wavelength of 400 nm or more as the main emission spectrum; and further thermopolymerizing the composition by heating.

BEST MODE FOR CARRYING OUT THE INVENTION

Any monomer having a radically polymerizable group may be used as the radically polymerizable monomer used in the process for producing a photochromic cured product of the present invention. Examples of the radically polymerizable group include an acryloyl group, methacryloyl group and vinyl group.

Typical radically polymerizable monomers which can be advantageously used in the present invention are the following compounds:

diacrylate compounds and dimethacrylate compounds represented by the following formula (1):

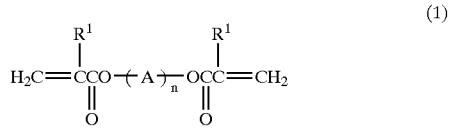

wherein two $R^1$'s are each independently a hydrogen atom or methyl group, A is an alkylene group which may be substituted, oxyalkylene group which may be substituted, or group represented by the following formula (1)-1:

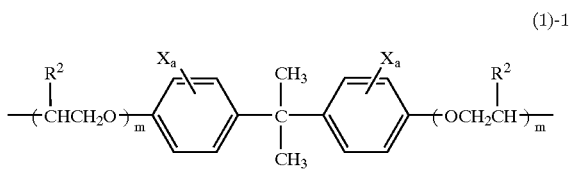
(1)-1 wherein $R^2$ is a hydrogen atom or methyl group, X is a halogen atom, m is an integer of 0 to 5, and a is an integer of 0 to 4 indicating the number of substituted halogen atoms, and n is an integer of 1 to 20, with the proviso that when n is 2 to 20, a plurality of A's may be the same or different; epoxy group-containing acrylate compounds and methacrylate compounds represented by the following formula (2):

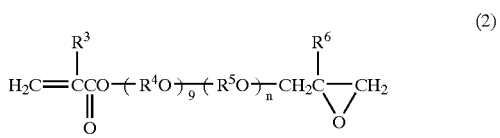
(2)

wherein $R^3$ and $R^6$ are each independently a hydrogen atom or methyl group, and $R^4$ and $R^5$ are each independently an alkylene group which may be substituted, or group represented by the following formula (2)-1:

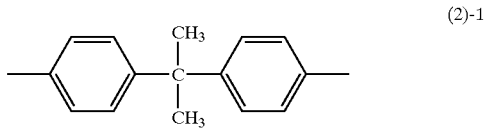
(2)-1 and g and h are each independently an integer of 0 to 20; vinylbenzyl compounds represented by the following formula (3):

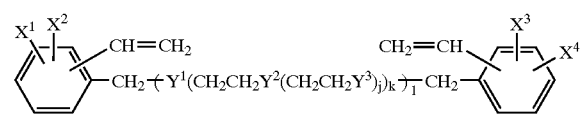
(3)

wherein $X^1$, $X^2$, $X^3$ and $X^4$ are each independently the same or different halogen atoms, $Y^1$, $Y^2$ and $Y^3$ are each independently an oxygen atom or sulfur atom, and j, k and l are each independently 0 or 1, with the proviso that when k=0, j=0, when l=0, k=j=0, and when j=k=l=1, $Y^1$, $Y^2$ and $Y^3$ cannot be a sulfur atom at the same time; and long-chain oxyalkylene compounds represented by the following formula (4):

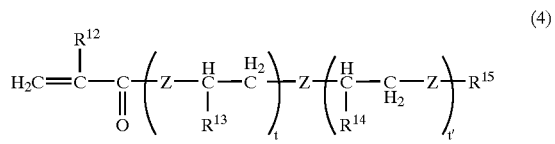
(4)

wherein $R^{12}$, $R^{13}$ and $R^{14}$ are each independently a hydrogen atom or alkyl group having 1 to 2 carbon atoms, $R^{15}$ is a hydrogen atom, alkyl group (preferably an alkyl group having 1 to 25 carbon atoms), alkoxyalkyl group, aryl group, acyl group, alkyl group having an epoxy group at a terminal, methacryloyl group, acryloyl group, haloalkyl group or oleyl group, Z is an oxygen atom or sulfur atom, t is an integer of 1 to 70, and t' is an integer of 0 to 70, with the proviso that when $R^{12}$ is a hydrogen atom and $R^{15}$ is a group other than the methacryloyl group and acryloyl group, or a hydrogen atom, t is an integer of 4 to 70, and when $R^{12}$ is an alkyl group and $R^{15}$ is a methacryloyl group, t is an integer of 7 to 70.

In addition to the compounds enumerated above, unsaturated carboxylic acid compounds, acrylic acid esters and methacrylic acid ester compounds, fumaric acid ester compounds and aromatic vinyl compounds may be used as the radically polymerizable monomer in the present invention.

Illustrative examples of the radically polymerizable monomer which can be advantageously used in the present invention are given below.

The diacrylate compounds and dimethacrylate compounds represented by the above formula (1) include diethylene glycol dimethacrylate, triethylene glycol dimethacrylate, tetraethylene glycol dimethacrylate, butanediol dimethacrylate, hexamethylenediol dimethacrylate, diethylene glycol diacrylate, triethylene glycol diacrylate, tetraethylene glycol diacrylate, butanediol diacrylate, hexamethylenediol diacrylate, bisphenol A dimethacrylate, 2,2-bis(4-methacryloyloxyethoxy-3,5-dibromophenyl)propane, 2,2-bis(4-methacryloyloxyethoxyphenyl)propane, 2,2-bis(4-methacryloyloxydiethoxyphenyl)propane, 2,2-bis(4-methacryloyloxytriethoxyphenyl)propane, and 2,2-bis(4-methacryloyloxypentaethoxyphenyl)propane.

The epoxy group-containing acrylate compounds and methacrylate compounds represented by the above formula (2) include glycidyl acrylate, glycidyl methacrylate, β-methylglycidyl acrylate, β-methylglycidyl methacrylate, bisphenol A-monoglycidyl ether methacrylate and glycidyl polyethylene glycol methacrylate having an average molecular weight of 538.

The vinylbenzyl compounds represented by the above formula (3) include bis-4-vinylbenzyl ether, bis-4-vinylbenzyl sulfide, 1,2-(p-vinylbenzyloxy)ethane, 1,2-(p-vinylbenzylthio)ethane and bis(p-vinylbenzyloxyethyl) sulfide.

The long-chain oxyalkylene compounds represented by the above formula (4) include polyethylene glycol methacrylate having an average molecular weight of 526, methyl ether polyethylene glycol methacrylate having an average molecular weight of 496, methyl ether polyethylene glycol methacrylate having an average molecular weight of 1,000, polypropylene glycol methacrylate having an average molecular weight of 622 and methyl ether polypropylene glycol methacrylate having an average molecular weight of 620.

The unsaturated carboxylic acid compounds include acrylic acid, methacrylic acid, maleic anhydride and fumaric acid; the acrylic acid ester and methacrylic acid ester compounds include methyl acrylate, methyl methacrylate, benzyl methacrylate, phenyl methacrylate, tribromophenyl methacrylate, 2-hydroxyethyl methacrylate, trifluoromethyl methacrylate and urethane acrylate; the fumaric acid ester compounds include monomethyl fumarate, diethyl fumarate and diphenyl fumarate; and the aromatic vinyl compounds include styrene, chlorostyrene, α-methylstyrene, vinylnaphthalene, isopropenyl naphthalene, bromostyrene and divinylbenzene.

These radically polymerizable monomers may be used alone or in admixture of two or more.

Out of the above radically polymerizable monomers, a mixture of radically polymerizable monomers including a diacrylate compound or dimethacrylate compound represented by the above formula (3), an epoxy group-containing acrylate compound or methacrylate compound represented by the above formula (2) and a long-chain oxyalkylene compound represented by the above formula (4) and a mixture of radically polymerizable monomers including a diacrylate compound and a dimethacrylate compound represented by the above formula (1) and an epoxy group-containing acrylate compound or methacrylate compound represented by the above formula (2) are preferred in view of the physical properties such as photochromism durability and color development-color fading of a cured product obtained by polymerizing a mixture of a photochromic compound which will be described hereinafter and a radically polymerizable monomer.

Use of an ultraviolet polymerization initiator having the main absorption at an ultraviolet range and a molar absorption coefficient for light having a wavelength of 400 nm of 150 l/(mol·cm) or more is essential to the present invention. When an ultraviolet polymerization initiator having the main absorption at a visible range of 400 nm or more is used, the photochromic cured product is colored disadvantageously before the photochromic compound exhibits photochromism to develop color because the ultraviolet polymerization initiator itself is colored. Further, when an ultraviolet polymerization initiator has a molar absorption coefficient for light having a wavelength of 400 nm of less than 150 l/(mol·cm) though it has the main absorption at an ultraviolet range, it is difficult to obtain a cured product in a short period of time because cleavage thereof hardly occurs upon exposure to activation energy rays having a wavelength of 400 nm or more as the main emission spectrum. In other words, as the photochromic compound generally absorbs ultraviolet rays having a wavelength of 380 nm to 400 nm to develop color, it absorbs activation energy rays required for the cleavage of the ultraviolet polymerization initiator with the result that the cleavage of the ultraviolet polymerization initiator hardly occurs and polymerization cannot be completed in a short period of time. When the activation energy rays is irradiated for a long time to complete polymerization, the deterioration of the photochromic compound occurs disadvantageously.

Ultraviolet polymerization initiators can be divided into a self-cleavage type and a hydrogen extraction type. An ultraviolet polymerization initiator of the latter type is generally used in conjunction with a photosensitizer. An amine compound is generally used as this photosensitizer. When the amine compound is used, the initial coloring of the polymer becomes marked. Therefore, an ultraviolet polymerization initiator of a self-cleavage type is preferably used. Out of ultraviolet polymerization initiators of a self-cleavage type, α-aminoalkylphenone-based ultraviolet polymerization initiators, acylphosphine oxide-based ultraviolet polymerization initiators and bisacylphosphine oxide-based ultraviolet polymerization initiators are preferred because the obtained cured products are achromatic and transparent.

The preferred ultraviolet polymerization initiator is not particularly limited but typical examples of the ultraviolet polymerization initiator are compounds represented by the following formula (5):

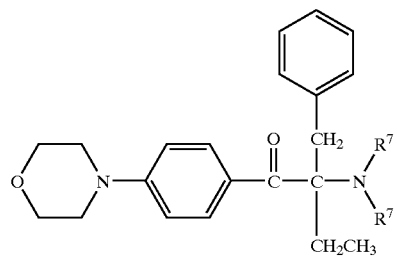

(5)

wherein two $R^7$'s are each independently a methyl group or ethyl group, compounds represented by the following formula (6):

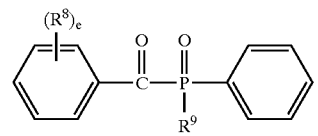

(6)

wherein a plurality of $R^8$'s are each independently a methyl group, methoxy group or chlorine atom, e is 2 or 3, and $R^9$ is a phenyl group or methoxy group, and compounds represented by the following formula (7):

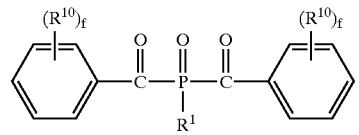

(7)

wherein a plurality of $R^{10}$'s are each independently a methyl group, methoxy group or chlorine atom, f is 2 or 3 and $R^{11}$ is a 2,4,4-trimethylpentyl group or phenyl group.

Illustrative examples of the ultraviolet polymerization initiator which can be advantageously used in the present invention as the ultraviolet polymerization initiator having the main absorption at an ultraviolet range and a molar absorption coefficient for light having a wavelength of 400 nm of 150 liter/(mol·cm) or more are given below.

α-aminoalkylphenone-based ultraviolet polymerization initiators;
(1) 2-benzyl-2-dimethylamino-1-(4-morpholinophenyl)-butanone-1 acylphosphine oxide-based ultraviolet polymerization initiators;
(1) 2,6-dimethylbenzoyldiphenylphosphine oxide
(2) 2,4,6-trimethylbenzoyldiphenylphosphine oxide
(3) 2,6-dichlorobenzoyldiphenylphosphine oxide
(4) 2,6-dimethoxybenzoyldiphenylphosphine oxide bisacylphosphine oxide-based ultraviolet polymerization initiators;
(1) bis(2,6-dimethoxybenzoyl)-2,4,4-trimethylpentylphosphine oxide
(2) bis(2,6-dimethylbenzoyl)-2,4,4-trimethylpentylphosphine oxide
(3) bis(2,4,6-trimethylbenzoyl)-2,4,4-trimethylpentylphosphine oxide
(4) bis(2,6-dichlorobenzoyl)-2,4,4-trimethylpentylphosphine oxide
(5) bis(2,4,6-trimethylbenzoyl)phenylphosphine oxide These ultraviolet polymerization initiators may be used alone or in combination of two or more.

The amount of the ultraviolet polymerization initiator differs according to polymerization conditions, the type of the initiator and the type and composition of the radically polymerizable monomer and cannot be limited unconditionally but it is preferably 0.01 to 1 part by weight, more preferably 0.05 to 1 part by weight based on 100 parts by weight of the radically polymerizable monomer. Within the above range, a cured product having sufficiently high hardness is obtained. The obtained cured product is excellent in internal unlformity and color.

The thermopolymerization initiator used in the present invention is not particularly limited and any known thermopolymerization initiator may be used. It is advantageously a thermopolymerization initiator which has a temperature at which the half-life (the time elapsed until the amount of active oxygen is halved by the decomposition of the initiator at a certain temperature) of the initiator is 10 hours of preferably more than 40° C., more preferably more than 50° C. When the temperature at which the half-life is 10 hours is higher than 40° C., the thermopolymerization initiator is hardly decomposed by polymerization heat generated during photopolymerization, whereby photopolymerization and thermopolymerization do not proceed at the same time, thereby making it possible to obtain a cured product which has high photochromism durability and little optical strain. The upper limit of the temperature at which the half-life of the thermopolymerization initiator is 10 hours is not particularly limited but commercially available thermopolymerization initiators generally have a temperature of 100° C. or less.

Illustrative examples of the thermopolymerization initiator which can be advantageously used in the present invention are given below.
diacyl peroxides;
(1) benzoyl peroxide
(2) octanoyl peroxide
(3) lauroyl peroxide
(4) acetyl peroxide
peroxy esters;
(1) t-butylperoxy isobutyrate
(2) t-butylperoxy benzoate
(3) 1,1,3,3-tetramethylbutylperoxy-2-ethyl hexanoate
others;
(1) azobisisobutyronitrile
(2) 2,2-azobis(2,4-dimethylvaleronitrile)

These thermopolymerization initiators maybe used alone or in combination of two or more.

The amount of the thermopolymerization initiator differs according to polymerization conditions, the type of the initiator and the type and composition of the radically polymerizable monomer and cannot be limited unconditionally but it is preferably 0.001 to 10 parts by weight, more preferably 0.01 to 5 parts by weight based on 100 parts by weight of the radically polymerizable monomer.

Any photochromic compound may be used in the present invention if it absorbs visible light when it develops color. Describing specifically the absorption of visible light, a photochromic compound which has an absorption spectrum at a wavelength of around 400 to 480 nm develops yellow to orange color, a photochromic compound which has an absorption spectrum at a wavelength of around 480 to 550 nm develops red to purple color, and a photochromic compound which has an absorption spectrum at a wavelength of around 550 to 600 nm develops purple to blue color. These photochromic compounds may be used alone, while they are used in combination of two or more so that neutral tints such as gray, brown and amber can be obtained.

Examples of the photochromic compound which is advantageously used in the present invention are a chromene compound, fulgide or fulgimide compound and spirooxazine compound.

Any known compound having a chromene skeleton and photochromism may be used as the chromene compound. Illustrative examples of the chromene compound are given below.
(1) 5-isopropyl-2,2-diphenyl-2H-benzo(h)chromene
(2) 5-t-butyl-2,2-diphenyl-2H-benzo(h)chromene
(3) spiro(norbornane-2,2'-(2H)benzo(h)chromene)
(4) spiro(bicyclo[3.3.1]nonane-9,2'-(2H)benzo(h)chromene)
(5) 7'-methoxyspiro(bicyclo[3.3.1]nonane-9,2'-(2H)benzo(h)chromene)
(6) 3,3-bis(3-fluoro-4-methoxyphenyl)-6-morpholino-3H-benzo(f)chromene
(7) 2,2-dimethyl-7-octoxy(2H)benzo(f)chromene Any known compound having a fulgide skeleton and photochromism may be used as the fulgide compound. Illustrative examples of the fulgide compound are given below.
(1) N-methyl-6,7-dihydro-4-methylspiro(5,6-benzo[b]thiophenedicarboxyimide-7,2-tricyclo[3.3.1.1$^{3.7}$]decane
(2) N-cyanomethyl-6,7-dihydro-4-methyl-2-phenylspiro(5,6-benzo[b]thiophenedicarboxyimide-7,2-tricyclo[3.3.1.1$^{3.7}$]decane
(3) N-cyanomethyl-6,7-dihydro-2-(p-methoxyphenyl)-4-methyl-spiro(5,6-benzo[b]thiophenedicarboxyimide-7,2-tricyclo[3.3.1.1$^{3.7}$] decane
(4) N-cyanomethyl-6,7-dihydro-4-methylspiro(5,6-benzo[b]thiophenedicarboxyimide-7,2-tricyclo[3.3.1.1$^{3.7}$] decane
(5) N-cyanomethyl-4-cyclopropyl-6,7-dihydrospiro(5,6-benzo[b]thiophenedicarboxyimide-7,2-tricyclo[3.3.1.1$^{3.7}$]decane
(6) N-cyano-4-cyclopropyl-6,7-dihydrospiro(5,6-benzo[b]thiophenedicarboxyimide-7,2-tricyclo[3.3.1.1$^{3.7}$]decane
(7) N-cyanomethyl-4-cyclopropyl-6,7-dihydro-2-(p-methoxyphenyl)spiro(5,6-benzo[b]thiophenedicarboxyimide-7,2-tricyclo[3.3.1.1$^{3.7}$]decane Any known compound having a spirooxazine skeleton and photochromism may be used as the spirooxazine compound. Illustrative examples of the spirooxazine compound are given below.
(1) 1',5'-dimethyl-4'-fluoro-6"-morpholinodispiro(cyclohexane-1.3'-(3H)indole-2'-(2H),3-(3H)naphtho(3,2-a)(1,4)oxazine)
(2) 6'-fluoro-1'-methyl-5"-nitriledispiro(cyclohexane-1,3'-(3H)indole-2'-(2'H)3"-(3H)naphtho(3,2-a)(1,4)oxazine)
(3) 6'-fluoro-1'-isobutyl-5"-nitriledispiro(cyclohexane-1,3'-(3H)indole-2'-(2'H)$_3$'-(3H)naphtho(3,2-a)(1,4)oxazine)
(4) 4',5'-dimethyl-1'-isobutyldispiro(cyclohexane-1,3'-(3H)indole-2'-(2'H)3"-(3H)naphtho(3,2-a)(1,4)oxazine)
(5) 1'-isobutyl-5"-acetonitriledispiro(cyclohexane-1.3'-(3H)indole-2'-(2'H)3"-(3H)naphtho(3,2-a)(1,4)oxazine)
(6) 6'-fluoro-1'-methoxycarbonylethyl-8"-methoxy-6"-piperidinodispiro(cyclohexane-1,3'-(3H)indole-2'-(2'H)3"-(3H)naphtho(3,2-a)(1,4)oxazine)
(7) 4'-fluoro-1'-isobutyl-5"-methyl-6"-morpholinodispiro(cyclohexane-1.3'-(3H)indole-2'-(2H),3"-(3H)naphtho(3,2-a)(1,4)oxazine)

The amount of the photochromic compound is suitably selected according to the strength of developed color. It is, for example, 0.001 to 1 part by weight, preferably 0.01 to 0.5 part by weight based on 100 parts by weight of the radically polymerizable monomer. Within this range, polymerization is liable to be completed in a short period of time and the obtained cured product has the sufficient color strength of the photochromic compound and high photochromism durability.

Known stabilizers and additives such as a release agent, ultraviolet light absorbent, ultraviolet light stabilizer, antioxidant, color protection agent, antistatic agent, fluorescent dye, dye, pigment and perfume may be suitably contained in the polymerizable composition used in the present invention as required.

The activation energy rays irradiated in the present invention must have a wavelength of 400 nm or more as the main emission spectrum. When the main emission spectrum of the activation energy rays is below 400 nm, the photochromic compound which has developed color absorbs the activation energy rays for the cleavage of the ultraviolet polymerization initiator and the cleavage of the ultraviolet polymerization initiator hardly occurs, thereby making it impossible to complete polymerization in a short period of time, because the photochromic compound generally absorbs ultraviolet rays having a wavelength of 380 to 400 nm to develop color. When the activation energy rays is irradiated for a long time to complete polymerization, the photochromic compound deteriorates disadvantageously.

A light source which emits activation energy rays having a wavelength of 400 nm or more as the main emission spectrum, namely, a light source which has the main emission spectrum of a visible range may be used as the light source used for the irradiation of the activation energy rays in the present invention. When a light source which emits activation energy rays having a wavelength of less than 400 nm as the main emission spectrum is used, an ultraviolet cut filter is used to cut off or reduce the activation energy rays having a wavelength of less than 400 nm, thereby making it possible to suppress the color development of the photochromic compound and to use even a light source which emits light including activation energy rays having a wavelength of less than 400 nm. However, it is not necessary to completely cut a spectrum of less than 400 nm of a light source in the actual curing operation and the activation energy rays may include activation energy rays having an ultraviolet range of less than 400 nm as far as the main emission spectrum thereof is a wavelength of 400 nm or more. Although the photochromic compound develops weak color with the activation energy rays having an ultraviolet range and absorbs part of the activation energy rays in this case, it can transmit substantially the activation energy rays having a wavelength of 400 nm or more and can cleave the ultraviolet polymerization initiator, whereby polymerization and curing proceed.

Illustrative examples of the light source which can be advantageously used in the present invention include a metal halide lamp, intermediate-pressure mercury lamp, high-pressure mercury lamp, super high-pressure mercury lamp, bactericidal lamp, xenon lamp and tungsten lamp. When a lamp such as a metal halide lamp or high-pressure mercury lamp of which light sources emit ultraviolet rays and visible rays simultaneously is used, an ultraviolet cut filter or the like must be used to cut or reduce activation energy rays having an ultraviolet range.

As the exposure time differs according to the wavelength and intensity of light from a light source and the shape and constituent components of a cured product, it is preferably predetermined by carrying out preliminary experiments. Generally speaking, the time required for polymerization can be made much shorter than when only thermopolymerization is carried out by carrying out exposure for 0.5 to 100 minutes.

When exposure to the activation energy rays is carried out, the temperature of the cured product is generally raised by polymerization heat. In this case, when the polymerization temperature rises too high, the cleavage of the thermopolymerization initiator occurs by polymerization heat, whereby photopolymerization and thermopolymerization occur at the same time. When photopolymerization and thermopolymerization occur at the same time, the photochromism durability of the photochromic cured product obtained by polymerization lowers and the optical distortion thereof becomes large disadvantageously. Therefore, when the temperature of the cured product of the polymerizable composition during photopolymerization is lower than the half-life temperature of the thermopolymerization initiator to suppress the proceeding of thermopolymerization during photopolymerization, a cured product having little optical distortion and excellent optical characteristics can be obtained. Consequently, it is preferred to suitably set photopolymerization conditions to ensure that the temperature of the cured product should not exceed 50° C. during photopolymerization. To this end, it is preferred to select the intensity of the activation energy rays from a range of 1 to 2 kW and the distance between the cured product and the activation energy rays from a range of 10 to 100 cm or to cool the cured product as required.

When exposure to the activation energy rays is to be carried out, at least the face to be exposed of a mold must be transparent, and glass is preferably used in this portion. Particularly, a material which easily transmits ultraviolet rays such as quartz glass is preferred but any material may be used if it is transparent. Polymerization may be carried out while pressure is applied from the outside during molding.

Following photopolymerization by exposure to the activation energy rays, thermopolymerization is carried out by heating. In the production process of the present invention, prepolymerization is carried out by photopolymerization by means of the irradiation of activation energy rays and then polymerization is completed by thermopolymerization by heating. Short-time prepolymerization is carried out by photopolymerization, whereby the total polymerization time can be reduced. When the order is reversed, that is, prepolymerization is carried out by thermopolymerization, a satisfactory cured product cannot be obtained in a short period of time and much time is taken.

Out of the conditions of heating which is carried out after the irradiation of the activation energy rays, temperature has an influence upon the properties of the obtained photochromic resin. Since this temperature condition is influenced by the type and amount of the thermopolymerization initiator and the type of the radically polymerizable monomer and cannot be limited unconditionally, it is preferred to heat at a temperature higher than the heat generation temperature at the end of the irradiation of the activation energy rays and to terminate thermopolymerization at a high temperature. As the polymerization time also differs according to various factors same as temperature conditions, the optimum time is suitably determined according to these conditions.

Generally speaking, a method in which the temperature is raised to any temperature from 90 to 120° C. in 1 to 180 minutes from the temperature right after the end of photopolymerization and that temperature is maintained for 10 to 300 minutes to complete polymerization is preferably employed.

The production process of the present invention may be a known cast polymerization process. Stating a typical example of the process, a polymerizable composition is injected into a space between molds maintained by an elastomer gasket or spacer, exposed to the above activation energy rays to be cured and further cured by thermopolymerization by heating, and then the cured product is taken out.

The photochromic cured product obtained by the process of the present invention may be further subjected to the following treatment according to its application purpose. That is, processing or a secondary treatment such as dyeing using a disperse dye, an anti-reflection treatment or antistatic treatment by the deposition of a thin film of a hard coat agent essentially composed of a silane coupling agent and a sol component such as silicon, zirconium, antimony, aluminum, tin or tungsten, or a metal oxide such as $SiO_2$, $TiO_2$ or $ZrO_2$, or the formation of a thin film of an organic polymer by coating may be carried out.

By employing the production process of the present invention which combines photopolymerization and thermopolymerization, a photochromic cured product which is free from the deterioration of a photochromic compound during polymerization and has high color strength and sufficiently high hardness can be obtained in a short period of time. The obtained cured product turns from chromatic to colored upon exposure to light including ultraviolet rays, such as sunlight or light from a mercury lamp, and returns to the original state upon the stoppage of exposure, and has excellent light controllability and repeated durability. Therefore, the obtained cured product is useful as organic glass having photochromism and can be advantageously used for photochromic lens application.

EXAMPLES

The following Examples and Comparative Examples are provided for the purpose of further illustrating the present invention but are in no way to be taken as limiting. "Parts" in the following Examples means "parts by weight".

1. Radically Polymerizable Monomer

The following radically polymerizable monomers were used in the Examples.
M1: 2,2-bis(4-methacryloyloxyethoxyphenyl)propane
M2: 2,2-bis(4-methacryloyloxypentaethoxyphenyl)propane
M3: triethylene glycol dimethacrylate
M4: tetraethylene glycol dimethacrylate
M5: glycidyl methacrylate
M6: isobornyl acrylate
M7: α-methylstyrene
M8: α-methylstyrene dimer 2. Photochromic Compound The following photochromic compounds were used.
2-1. Chromene Compound
C1: spiro(bicyclo[3.3.1]nonane-9,2'-(2H)benzo(h)chromene)
C2: 3,3-bis(3-fluoro-4-methoxyphenyl)-6-morpholino-3H-benzo(f)chromene
C3: 5-isopropyl-2,2-diphenyl-2H-benzo(h)chromene
2-2. Fulgide Compound F1: N-cyanomethyl-6,7-dihydro-2-(p-methoxyphenyl)-4-methylspiro(5,6-benzo[b]thiophenedicarboxyimide-7,2-tricyclo[3.3.1.1$^{3.7}$]decane
F2: N-cyanomethyl-4-cyclopropyl-6,7-dihydro-2-(p-methoxyphenyl)spiro(5,6-benzo[b]thiophenedicarboxyimide-7,2-tricyclo[3.3.1.1$^{3.7}$]decane
2-3. Spirooxazine Compound
S1: 1',5'-dimethyl-4'-fluoro-6"-morpholinodispiro(cyclohexane-1,3'-(3H)indole-2'-(2H),3"-(3H)naphtho(3,2-a)(1,4)oxazine)
S2: 6'-fluoro-1'-methyl-5'-nitriledispiro(cyclohexane-1,3'-(3H)indole-2'-(2'H)$_3$'-(3H)naphtho(3,2-a)(1,4)oxazine)

3. Ultraviolet Polymerization Initiator

The following ultraviolet polymerization initiators were used. The figures within parentheses after the names of compounds indicate a molar absorption coefficient for light having a wavelength of 400 nm (liter/(mol·cm)).
P1: CGI-1700 (trade name: Nippon Ciba Geigy Co., Ltd.) a 1:3 mixture of bis(2,6-dimethoxybenzoyl)-2,4,4-trimethylpentylphosphine oxide (550) and 2-hydroxy-2-methyl-1-phenylpropane-1-one (10 or less)
P2: 2,4,6-trimethylbenzoyldiphenylphosphine oxide (250)
P3: 2-benzyl-2-dimethylamino-1-(4-morpholinophenyl)butanone-1 (200)
P4: methylbenzoyl formate (10 or less)
P5: Irgacure 819 (trade name: Nippon Ciba Geigy Co., Ltd.) bis(2,4,6-trimethylbenzoyl)phenylphosphine oxide (604)

4. Thermopolymerization Initiator

The following thermopolymerization initiators were used. The figures within parentheses after the names of compounds indicate a temperature (° C) at which the half-life is 10 hours.
T1: t-butylperoxy neodecanoate (46)
T2: t-butylperoxy isobutyrate (77)
T3: 1,1,3,3-tetramethylbutylperoxy-2-ethylhexanoate (65)
T4: diisopropylperoxy dicarbonate (41)
T5: benzoyl peroxide (74)
T6: octanoyl peroxide (62)
T7: 2,2-azobis(2,4-dimethylvaleronitrile) (51)

Example 1

38 parts of M1, 38 parts of M2, 5 parts of M5, 15 parts of M6, 3 parts of M7 and 1 part of M8 out of the above radical polymerizable monomers, 0.05 part of F1 as a photochromic compound, 0.5 part of T2 as a thermopolymerization initiator and 0.5 part of P1 as an ultraviolet polymerization initiator were added and mixed together fully. This mixed solution was injected into a mold consisting of a glass plate and a gasket made from an ethylene-vinyl acetate copolymer, a filter capable of cutting 99% of a wavelength of 380 nm, 98% of a wavelength of 390 nm, 50% of a wavelength of 400 nm and 15% of a wavelength of 410 nm of activation energy rays as an ultraviolet cutting filter was interposed between a metal halide lamp and the mold to irradiate activation energy rays having a wavelength of 400 nm or more, and activation energy rays having a wavelength of 400 nm or more as the main emission spectrum was irradiated using the metal halide lamp having an output of 120 W/cm for 2 minutes. The temperature during irradiation was maintained at 50° C. Thereafter, the temperature was gradually raised from 60 to 110° C. over 30 minutes with an air furnace and maintained at 110° C. to carry out polymerization for 2 hours. After the end of polymerization, a cured product was taken out from the glass mold. The above polymerization conditions are shown in Table 1.

Hardness

The Rockwell hardness (HL) of the obtained cured product (thickness of 2 mm) was measured with the Rockwell hardness tester of Akashi Co., Ltd.

Optical Distortion

The optical distortion of the obtained cured product was observed under crossed Nicols. The cured product was evaluated as 0 when no optical distortion was observed and X when optical distortion was observed.

Colorability and Deterioration During Polymerization

The colorability of the obtained cured product was evaluated by absorbance (ABS.) at the maximum absorption wavelength (λmax (nm)) based on color developed by the photochromic compound by irradiating the cured product with light from the L-2480 (300 W) SHL-100 xenon lamp of Hamamatsu Photonics Co., Ltd. through an aeromass filter (of Corning Co., Ltd.) at 25° C.±1° C. and a beam strength on the surface of the cured product of 365 nm=17 mW/cm$^2$ for 15 seconds. The deterioration of the photochromic compound during polymerization was evaluated by the existence of the initial coloring of the cured product (absorbance (ABS.) at the maximum absorption wavelength (λmax (nm)) before color development).

Repeated Durability

The retention (%) of absorbance by the above measurement method after the cured product was deteriorated for 20 hours by the X25 xenon weather meter of Suga Shikenki Co., Ltd. retention (%)=(absorbance at the time of color development at the maximum absorption wavelength after deterioration)/(absorbance at the time of color development at the maximum absorption wavelength before deterioration)×100

The above results are shown in Table 3.

Examples 2 to 9

The procedure of Example 1 was repeated except that polymerization was carried out using a photochromic compound, ultraviolet polymerization initiator and thermopolymerization initiator shown in Table 1 under conditions shown in Table 1. The above results are shown in Table 3.

Comparative Example 1

Only photopolymerization was carried out. The procedure of Example 1 was repeated except that only photopolymerization was carried out using an ultraviolet polymerization initiator shown in table 1 under conditions shown in Table 1. The results are shown in Table 3.

Comparative Example 2

Polymerization was carried out using an ultraviolet polymerization initiator having a molar absorption coefficient for light having a wavelength of 400 nm of less than 150 liter/(mol·cm). The procedure of Example 1 was repeated except that photopolymerization was carried out using the ultraviolet polymerization initiator shown in Table 1 under conditions shown in Table 1. The results are shown in Table 3.

Comparative Example 3

Only thermopolymerization was carried out. The procedure of Example 1 was repeated except that only thermopolymerization was carried out under conditions shown in Table 1. The results are shown in Table 3.

Examples 10 to 12

A mixture of a photochromic compound was used as the photochromic compound. The procedure of Example 1 was repeated except that polymerization was carried out using the photochromic compound, ultraviolet polymerization initiator and thermopolymerization initiator shown in Table 1 under conditions shown in Table 1. The results are shown in Table 3.

Comparative Examples 4 to 6

Only photopolymerization was carried out. The procedure of Examples 10 to 12 was repeated except that only photopolymerization was carried out under conditions shown in Table 1. The results are shown in Table 3.

Examples 13 to 19

The procedure of Example 1 was repeated except that polymerization was carried out using 70 parts of M3, 20 parts of M4 and 10 parts of M5 as radical polymerizable monomers, photochromic compound, ultraviolet polymerization initiator and thermopolymerization initiator shown in Table 2 under conditions shown in Table 1. The results are shown in Table 3.

Comparative Examples 7 to 10

Only photopolymerization was carried out. The procedure of Example 13 was repeated except that polymerization was carried out using an ultraviolet polymerization initiator shown in Table 2 by irradiating light for only 20 minutes. The results are shown in Table 3.

In Table 1, compared with Examples 1 to 3 and Comparative Example 3 (only thermopolymerization) in which the same radical polymerizable monomer and the same photochromic compound were used, the total polymerization time required for the production of a cured product was greatly reduced in Examples 1 to 3. In Table 3, compared with Examples 1 to 3, Comparative Example 1 (only photopolymerization) and Comparative Example 2 (the molar absorption coefficient of the ultraviolet polymerization initiator was less than 150 liter/(mol·cm)), the cured products obtained in Examples 1 and 3 had high hardness, were not colored initially and had high colorability. Further, the obtained cured products were excellent in repeated durability.

TABLE 1

| | | photopolymerization | | |
| --- | --- | --- | --- | --- |
| | photochromic compound (parts by weight) | photopolymerization initiator (parts by weight) | exposure time of activation energy rays (min.) | temperature during exposure (° C.) |
| Ex. 1 | F1(0.05) | P1(0.5) | 2 | 50 |
| Ex. 2 | F1(0.05) | P1(0.5) | 1 | 40 |
| Ex. 3 | F1(0.05) | P2(0.5) | 3 | 50 |
| Ex. 4 | C1(0.5) | P2(1) | 2 | 50 |
| Ex. 5 | C1(0.05) | P3(0.3) | 1 | 40 |
| Ex. 6 | S1(0.01) | P1(0.5) | 1 | 50 |

TABLE 1-continued

| | | | | |
|---|---|---|---|---|
| Ex. 7 | S1(0.05) | P1(1) | 2 | 50 |
| Ex. 8 | C1(0.05) | P5(0.1) | 3 | 50 |
| Ex. 9 | C1(0.05) | P5(0.01) | 20 | 40 |
| Ex. 10 | C2/C3/S1/F2 (0.025)/(0.015)/(0.05)/(0.04) | P2(0.1) | 2 | 50 |
| Ex. 11 | C1/F1/S1 (0.05)/(0.07)/(0.055) | P1(0.5) | 2 | 50 |
| Ex. 12 | C2/C3/S1/S2 (0.01)/(0.1)/(0.03)/(0.03) | P5(0.1) | 2 | 50 |
| C. Ex. 1 | F1(0.05) | P2(1) | 20 | 50 |
| C. Ex. 2 | F1(0.05) | P4(1) | 20 | 50 |
| C. Ex. 3 | F1(0.05) | — | — | — |
| C. Ex. 4 | C2/C3/S1/F2 (0.025)/(0.015)/(0.05)/(0.04) | P2(1) | 20 | 50 |
| C. Ex. 5 | C1/F1/S1 (0.05)/(0.07)/(0.055) | P1(1) | 20 | 50 |
| C. Ex. 6 | C2/C3/S1/S2 (0.01)/(0.1)/(0.03)/(0.03) | P5(0.1) | 20 | 50 |

| | thermopolymerization | | | total |
|---|---|---|---|---|
| | thermopolymerization initiator (parts by weight) | heating temperature (° C.) | heating time (h) | polymerization time (h) |
| Ex. 1 | T2(0.5) | 60~110 | 2 | 2.03 |
| Ex. 2 | T1(0.5) | 40~90 | 2 | 2.01 |
| Ex. 3 | T3(0.5) | 60~100 | 2 | 2.05 |
| Ex. 4 | T5(0.01) | 60~110 | 2 | 2.03 |
| Ex. 5 | T4(5) | 40~90 | 3 | 3.01 |
| Ex. 6 | T2(2) | 60~110 | 2 | 2.01 |
| Ex. 7 | T3(1) | 60~100 | 2 | 2.03 |
| Ex. 8 | T7(0.3) | 50~100 | 2 | 2.05 |
| Ex. 9 | T7(0.3) | 40~100 | 5 | 5.3 |
| Ex. 10 | T2(1) | 60~110 | 2 | 2.03 |
| Ex. 11 | T2(1) | 60~110 | 2 | 2.03 |
| Ex. 12 | T7(0.3) | 50~100 | 2 | 2.03 |
| C. Ex. 1 | — | — | — | 0.3 |
| C. Ex. 2 | T2(0.5) | 50~110 | 2 | 2.3 |
| C. Ex. 3 | T2(1) | 30~110 | 23 | 23 |
| C. Ex. 4 | — | — | — | 0.3 |
| C. Ex. 5 | — | — | — | 0.3 |
| C. Ex. 6 | | | | 0.3 |

Ex.: Example
C. Ex.: Comparative Example

TABLE 2

| | photopolymerization | | | | thermopolymerization | | | total |
|---|---|---|---|---|---|---|---|---|
| | photochromic compound (parts by weight) | photo-polymerization initiator (parts by weight) | exposure time of activation energy rays (min.) | temperature during exposure (° C.) | thermo-polymerization initiator (parts by weight) | heating temperature (° C.) | heating time (h) | poly-merization time (h) |
| Ex.13 | F1(0.05) | P2(0.1) | 2 | 50 | T2(0.5) | 60~110 | 2 | 2.03 |
| Ex.14 | C2(0.1) | P1(0.5) | 5 | 50 | T3(1) | 60~100 | 1 | 1.08 |
| Ex.15 | C2(0.3) | P3(0.05) | 1 | 40 | T6(1) | 40~100 | 5 | 5.02 |
| Ex.16 | S2(0.05) | P2(0.1) | 2 | 50 | T3(1) | 60~100 | 2 | 2.03 |
| Ex.17 | C3(0.05) | P3(0.05) | 3 | 50 | T5(0.5) | 60~100 | 3 | 3.05 |
| Ex.18 | C3(0.5) | P2(0.05) | 1 | 40 | T1(0.5) | 40~90 | 3 | 3.01 |
| Ex.19 | C2/C3/S1/S2 (0.01)/(0.1)/(0.03)/(0.03) | P2(0.1) | 2 | 50 | T2(1) | 60~110 | 2 | 2.03 |
| C.Ex.7 | F1(0.05) | P1(1) | 20 | 50 | — | — | — | 0.3 |
| C.Ex.8 | S2(0.05) | P2(0.1) | 20 | 50 | — | — | — | 0.3 |
| C.Ex.9 | C3(0.05) | P3(0.05) | 20 | 50 | — | — | — | 0.3 |
| C.Ex.10 | C2/C3/S1/S2 (0.01)/(0.1)/(0.03)/(0.03) | P2(1) | 20 | 50 | — | — | — | 0.3 |

Ex.: Example
C.Ex.: Comparative Example

TABLE 3

| | Hardness HL | initial coloring | λmax (nm) | ABS. | developed color | durability (%) | optical distorsion |
|---|---|---|---|---|---|---|---|
| Ex. 1 | 96 | achromatic | 580 | 0.8 | blue | 60 | ○ |
| Ex. 2 | 95 | achromatic | 580 | 0.45 | blue | 45 | ○ |
| Ex. 3 | 95 | achromatic | 580 | 0.6 | blue | 55 | ○ |
| Ex. 4 | 92 | achromatic | 450 | 1.7 | yellow | 100 | ○ |
| Ex. 5 | 95 | achromatic | 450 | 1.2 | yellow | 88 | ○ |
| Ex. 6 | 95 | achromatic | 590 | 0.7 | blue | 100 | ○ |
| Ex. 7 | 93 | achromatic | 590 | 0.9 | blue | 100 | ○ |
| Ex. 8 | 95 | achromatic | 450 | 1.2 | yellow | 95 | ○ |
| Ex. 9 | 97 | weak yellow | 450 | 0.8 | yellow | 92 | ○ |
| Ex. 10 | 95 | achromatic | 450 | 0.5 | brown | 84 | ○ |
| | | | 590 | 0.9 | | 85 | |
| Ex. 11 | 95 | achromatic | 450 | 0.5 | gray | 81 | ○ |
| | | | 590 | 0.8 | | 85 | |
| Ex. 12 | 95 | achromatic | 450 | 0.9 | brown | 95 | ○ |
| | | | 590 | 0.8 | | 96 | |
| C. Ex. 1 | 56 | yellow | 580 | 0.2 | blue | 0 | X |
| C. Ex. 2 | 49 | weak yellow | 580 | 0.1 | blue | 0 | X |
| C. Ex. 3 | 95 | achromatic | 580 | 0.9 | blue | 78 | ○ |
| C. Ex. 4 | 75 | weak yellow | 450 | 0.5 | yellowish | 73 | X |
| | | | 590 | 0.4 | brown | 15 | |
| C. Ex. 5 | 65 | weak yellow | 450 | 0.5 | yellowish gray | 62 | X |
| | | | 590 | 0.4 | | 10 | |
| C. Ex. 6 | 75 | weak yellow | 450 | 0.8 | yellowish | 85 | X |
| | | | 590 | 0.7 | brown | 82 | |
| Ex. 13 | 90 | achromatic | 574 | 0.6 | blue | 40 | ○ |
| Ex. 14 | 90 | weak yellow | 440 | 1.2 | yellow | 95 | ○ |
| Ex. 15 | 95 | weak yellow | 440 | 1.5 | yellow | 100 | ○ |
| Ex. 16 | 93 | achromatic | 640 | 1.2 | blue | 98 | ○ |
| Ex. 17 | 95 | achromatic | 470 | 0.7 | orange | 95 | ○ |
| Ex. 18 | 95 | achromatic | 470 | 1.1 | orange | 90 | ○ |
| Ex. 19 | 94 | achromatic | 450 | 0.9 | brown | 98 | ○ |
| | | | 630 | 0.8 | | 97 | |
| C. Ex. 7 | 60 | weak yellow | 574 | 0.4 | blue | 6 | X |
| C. Ex. 8 | 80 | achromatic | 640 | 1.0 | blue | 86 | X |
| C. Ex. 9 | 65 | achromatic | 470 | 0.5 | orange | 80 | X |
| C. Ex. 10 | 60 | weak yellow | 450 | 0.8 | brown | 83 | X |
| | | | 630 | 0.7 | | 80 | |

Ex.: Example
C. Ex.: Comparative Example

What is claimed is:

1. A process for producing a photochromic cured product, comprising the steps of:

photopolymerizing a polymerizable composition comprising (A) a radical polymerizable monomer, (b) an ultraviolet polymerization initiator having the main absorption at an ultraviolet range and a molar absorption coefficient for light having a wavelength of 400 nm of 150 liter/(mol·cm) or more, (C) a thermopolymerization initiator and (D) a photochromic compound by irradiating activation energy rays having a wavelength of 400 nm or more as the main emission spectrum; and further thermopolymerizing the composition by heating.

2. The process of claim 1, wherein the thermopolymerization initiator has a temperature of 40° C. or higher at which the half-life thereof is 10 hours.

3. The process of claim 1, wherein the photopolymerization of the polymerizable composition is carried out at the same temperature or less as a temperature at which the half-life of the thermopolymerization initiator is 10 hours.

4. The process of claim 1, wherein the photopolymerization of the polymerizable composition is carried out at a temperature of 50° C. or less.

5. The process of claim 1, wherein the photopolymerization of the polymerizable composition is carried out for 0.5 to 100 minutes.

6. The process of claim 1, wherein thermopolymerization is started at a temperature higher than the temperature of the eared product at the end of photopolymerization and further raising the temperature.

7. The process of claim 1, wherein the temperature of the product after the end of photopolymerization is raised to 90 to 120° C. and thermopolymerization is allowed to proceed at that temperature for 10 to 300 minutes.

* * * * *